United States Patent
Tsutsui et al.

(10) Patent No.: US 10,069,523 B2
(45) Date of Patent: *Sep. 4, 2018

(54) POWER AMPLIFICATION MODULE

(71) Applicant: Murata Manufacturing Co., Ltd., Kyoto (JP)

(72) Inventors: Takayuki Tsutsui, Kyoto (JP); Satoshi Tanaka, Kyoto (JP); Hidenori Obiya, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/837,499

(22) Filed: Dec. 11, 2017

(65) Prior Publication Data

US 2018/0102801 A1    Apr. 12, 2018

Related U.S. Application Data

(63) Continuation of application No. 15/455,860, filed on Mar. 10, 2017, which is a continuation of application (Continued)

(30) Foreign Application Priority Data

Dec. 24, 2015  (JP) ................................. 2015-252115

(51) Int. Cl.
*H04B 1/16* (2006.01)
*H04B 1/04* (2006.01)

(52) U.S. Cl.
CPC ... *H04B 1/0475* (2013.01); *H04B 2001/0408* (2013.01)

(58) Field of Classification Search
CPC .. H04B 15/00; H04B 1/44; H04B 2001/0408; H04B 1/0458; H04W 72/0453; H04W 72/0473; H03F 1/0277; H03F 3/2113
See application file for complete search history.

(56) References Cited

U.S. PATENT DOCUMENTS 6,484,017 B1 * 11/2002 Kim .................... H04B 1/04
                                                    330/280
7,773,956 B2 * 8/2010 Fukamachi .......... H04B 1/0057
                                                    333/132
(Continued)

FOREIGN PATENT DOCUMENTS

| JP | 2007-295327 A | 11/2007 |
|---|---|---|
| WO | 2007/079987 A1 | 7/2007 |
| WO | 2008/075691 A1 | 6/2008 |

*Primary Examiner* — Dominic Rego
(74) *Attorney, Agent, or Firm* — Pearne & Gordon LLP

(57) ABSTRACT

A power amplification module includes a first input terminal arranged to receive a first transmission signal in a first frequency band, a second input terminal arranged to receive a second transmission signal in a second frequency band higher than the first frequency band, a first amplification circuit that amplifies the first transmission signal, a second amplification circuit that amplifies the second transmission signal, a first filter circuit located between the first input terminal and the first amplification circuit, and a second filter circuit located between the second input terminal and the second amplification circuit. The first filter circuit is a low-pass filter that allows the first frequency band to pass therethrough and that attenuates a harmonic of the first transmission signal and the second transmission signal. The second filter circuit is a high-pass filter that allows the second frequency band to pass therethrough and that attenuates the first transmission signal.

20 Claims, 6 Drawing Sheets

Related U.S. Application Data

No. 15/349,017, filed on Nov. 11, 2016, now Pat. No. 9,647,775.

(56) References Cited

U.S. PATENT DOCUMENTS

| | | | |
|---|---|---|---|
| 8,570,103 B2 | 10/2013 | Chang | |
| 8,731,490 B2* | 5/2014 | Smith | H04B 1/0475 375/216 |
| 2004/0202311 A1* | 10/2004 | Zhao | H03F 3/607 379/395 |
| 2007/0161358 A1 | 7/2007 | Bogdan | |
| 2008/0136559 A1* | 6/2008 | Takahashi | H03H 7/465 333/167 |
| 2009/0131001 A1 | 5/2009 | Breslin | |
| 2010/0091752 A1 | 4/2010 | Kemmochi et al. | |
| 2010/0157858 A1* | 6/2010 | Lee | H01Q 9/40 370/297 |
| 2011/0057730 A1* | 3/2011 | Makioka | H03F 1/32 330/295 |
| 2012/0157029 A1 | 6/2012 | Matsuura | |
| 2012/0229192 A1* | 9/2012 | Katoh | H03K 17/063 327/427 |
| 2013/0225107 A1* | 8/2013 | Lane | H04B 1/04 455/234.1 |
| 2015/0244338 A1* | 8/2015 | Lee | H03G 3/3042 455/127.2 |
| 2015/0318890 A1 | 11/2015 | Uejima | |
| 2015/0341002 A1 | 11/2015 | Lee et al. | |
| 2016/0006415 A1 | 1/2016 | Takematsu | |
| 2016/0112072 A1* | 4/2016 | Bauder | H04B 1/0057 370/297 |
| 2016/0142832 A1 | 5/2016 | Hillbratt et al. | |
| 2016/0301371 A1 | 10/2016 | Ashworth | |

* cited by examiner

POWER AMPLIFICATION MODULE

This application is a continuation of U.S. patent application Ser. No. 15/455,860 filed on Mar. 10, 2017 which is a continuation of U.S. patent application Ser. No. 15/349,017 filed on Nov. 11, 2016 which claims priority from Japanese Patent Application No. 2015-252115 filed on Dec. 24, 2014. The content of these applications are incorporated herein by reference in their entirety.

BACKGROUND

The present disclosure relates to a power amplification module.

A technique for enabling a mobile communication device such as a mobile phone to transmit radio frequency (RF) signals to a base station by using a plurality of different frequency bands simultaneously (uplink carrier aggregation) has been attracting attention in recent years. There is a need to amplify power of a transmission signal to be transmitted to a base station. For example, Japanese Unexamined Patent Application Publication No. 2007-295327 discloses a high-frequency circuit including a power amplifier circuit that amplifies a low-frequency transmission signal, and a power amplifier circuit that amplifies a high-frequency transmission signal.

When uplink carrier aggregation is utilized, intermodulation distortion (IMD) occurs due to the presence of the fundamental wave and harmonics of a plurality of transmission signals, for example, and this distortion causes noise which may affect reception sensitivity. To address this issue, a configuration is contemplated in which, for example, as in the high-frequency circuit disclosed in Japanese Unexamined Patent Application Publication No. 2007-295327, a bandpass filter is disposed between a transmit terminal to which a transmission signal is input and a power amplifier circuit. However, insertion loss in the pass band of the bandpass filter may degrade efficiency.

BRIEF SUMMARY

Accordingly, the present disclosure provides a power amplification module that prevents, or reduces, the reduction in reception sensitivity caused by intermodulation distortion while preventing degradation in efficiency.

A power amplification module according to embodiments of the present disclosure includes a first input terminal arranged to receive a first transmission signal in a first frequency band, a second input terminal arranged to receive a second transmission signal in a second frequency band higher than the first frequency band, a first amplification circuit that receives the first transmission signal, amplifies the first transmission signal to produce a first amplified signal, and outputs the first amplified signal, a second amplification circuit that receives the second transmission signal, amplifies the second transmission signal to produce a second amplified signal, and outputs the second amplified signal, a first filter circuit located between the first input terminal and the first amplification circuit, and a second filter circuit located between the second input terminal and the second amplification circuit. The first filter circuit is a low-pass filter that allows the first frequency band to pass therethrough and that attenuates a harmonic of the first transmission signal and the second transmission signal, and the second filter circuit is a high-pass filter that allows the second frequency band to pass therethrough and that attenuates the first transmission signal.

According to embodiments of the present disclosure, it may be possible to provide a power amplification module that prevents, or reduces, the reduction in reception sensitivity caused by intermodulation distortion while preventing degradation in efficiency.

Other features, elements, characteristics and advantages of the present disclosure will become more apparent from the following detailed description of embodiments of the present disclosure with reference to the attached drawings.

DETAILED DESCRIPTION

Embodiments of the present disclosure will be described in detail hereinafter with reference to the drawings. The same or substantially the same elements are assigned the same numerals and will not be redundantly described.

Figure 1:
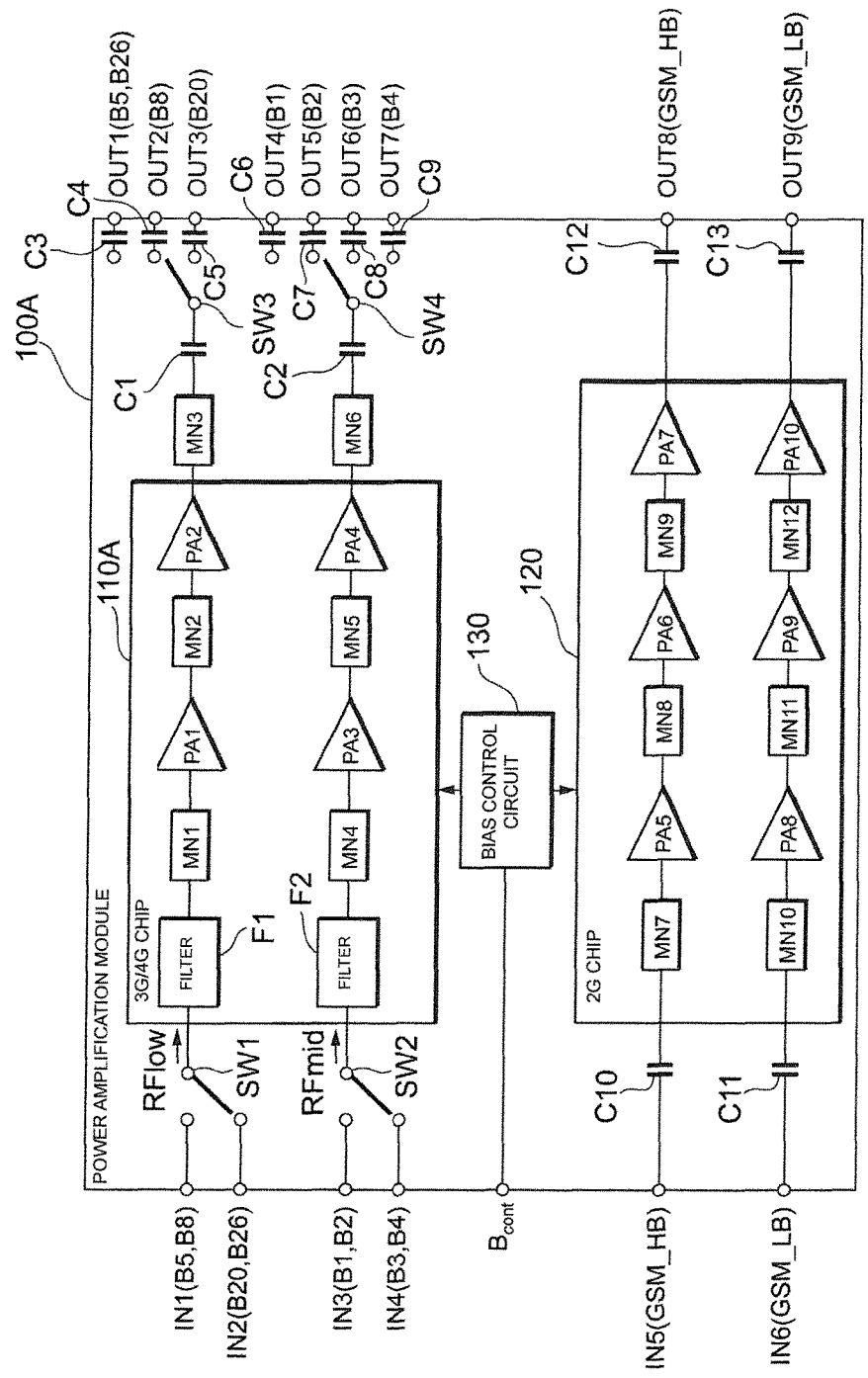
FIG. 1 is a diagram illustrating a configuration of a power amplification module according to an embodiment of the present disclosure.

FIG. 1 is a diagram illustrating a configuration of a power amplification module 100A according to an embodiment of the present disclosure. The power amplification module 100A has a function of simultaneously amplifying the power of RF signals in a plurality of frequency bands. The power amplification module 100A is located in a user terminal such as a mobile phone and is included in a transmit unit for processing a transmission signal to be transmitted to a base station. Although not illustrated in FIG. 1, the user terminal also includes a receive unit for processing a receive signal received from the base station. The transmit unit and the receive unit are provided as a single communication unit, for example.

The power amplification module 100A supports a plurality of communication standards (modes). In the example illustrated in FIG. 1, multiple modes of the second generation mobile communication system (2G), the third generation mobile communication system (3G), and the fourth generation mobile communication system (4G) are supported. However, the communication standards are not limited to those modes and other multiple modes, for example, multiple modes of 3G, 4G, and the fifth generation mobile communication system (5G), may be supported. In this embodiment, the power amplification module 100A supports three communication standards, by way of example. However, the power amplification module 100A may not necessarily support a plurality of communication standards and may support one communication standard or more than one communication standard.

The power amplification module 100A further supports a plurality of frequency bands. In FIG. 1, eight frequency bands, namely, B1 (transmit frequency band: 1920 to 1980 MHz), B2 (transmit frequency band: 1850 to 1910 MHz), B3 (transmit frequency band: 1710 to 1785 MHz), B4 (transmit frequency band: 1710 to 1755 MHz), B5 (transmit frequency band: 824 to 849 MHz), B8 (transmit frequency band: 880 to 915 MHz), B20 (transmit frequency band: 832 to 862 MHz), and B26 (transmit frequency band: 814 to 849 MHz), are depicted as example 3G/4G frequency bands. However, other frequency bands may be employed. In this embodiment, four frequency bands, namely, B1, B2, B3, and B4, are referred to as a middle band, and four frequency bands that are frequency bands lower than the middle band, namely, B5, B8, B20, and B26, are referred to as a low band. In addition, as exemplary 2G frequency bands, two frequency bands, namely, GSM (registered trademark) (global system for mobile communications) high band (GSM_HB) and low band (GSM_LB), are depicted.

Furthermore, the power amplification module 100A is a power amplification module that supports uplink carrier aggregation which provides simultaneous transmission of a plurality of transmission signals in different frequency bands. For example, a transmission signal in any frequency band (for example, B1) within the middle band and a transmission signal in any frequency band (for example, B5) within the low band simultaneously undergo power amplification and are simultaneously output.

Next, a description is given of individual components of the power amplification module 100A. As illustrated in FIG. 1, the power amplification module 100A includes a 3G/4G chip 110A, a 2G chip 120, a bias control circuit 130, matching networks (MNs) MN3 and MN6, switch elements SW1 to SW4, and capacitors C1 to C13.

The 3G/4G chip 110A (integrated circuit) amplifies and outputs 3G/4G RF signals supplied from input terminals IN1 to IN4. The 2G chip 120 amplifies and outputs 2G RF signals supplied from input terminals IN5 and IN6. The configuration of the 3G/4G chip 110A and the 2G chip 120 will be described in detail below.

The bias control circuit 130 generates a bias voltage/bias current in accordance with a control signal Bcont input from outside the power amplification module 100A, and supplies the bias voltage/bias current to power amplification circuits PA1 to PA4 in the 3G/4G chip 110A or power amplification circuits PA5 to PA10 in the 2G chip 120.

Each of the matching networks MN3 and MN6 is a circuit for matching the output impedance of a circuit located upstream thereof to the input impedance of a circuit located downstream thereof, and is implemented using a capacitor and an inductor. Matching networks MN1, MN2, MN4, MN5, and MN7 to MN15, described below, also have a similar configuration.

The switch element SW1 supplies a 3G/4G transmission signal input to the input terminal IN1 or IN2 to an amplification path for the low band in the 3G/4G chip 110A. The switch element SW2 supplies a 3G/4G transmission signal input to the input terminal IN3 or IN4 to an amplification path for the middle band in the 3G/4G chip 110A.

The switch element SW3 outputs an amplified transmission signal, in accordance with the frequency band of the 3G/4G transmission signal, to one of output terminals OUT1 (B5, B26), OUT2 (B8), and OUT3 (B20) for the corresponding frequency band. The switch element SW4 outputs an amplified transmission signal, in accordance with the frequency band of the 3G/4G transmission signal, to one of output terminals OUT4 (B1), OUT5 (B2), OUT6 (B3), and OUT7 (B4) for the corresponding frequency band. A single output terminal may be provided for each frequency band, or, like the output terminal OUT1, a single output terminal may be shared by several frequency bands.

The switch elements SW1 to SW4 may be mounted on a substrate of the power amplification module 100A by silicon-on-insulator (SOI), for example.

Each of the capacitors C1 to C13 removes the direct-current (DC) component of the transmission signal. Capacitors C14 to C16, described below, also perform a similar operation.

Next, a description is given of the configuration of the 3G/4G chip 110A and the 2G chip 120. The 3G/4G chip 110A includes the power amplification circuits PA1 to PA4, filter circuits F1 and F2, and the matching networks MN1, MN2, MN4, and MN5. The 2G chip 120 includes the power amplification circuits PA5 to PA10 and the matching networks MN7 to MN12.

Each of the power amplification circuits PA1 to PA10 is a circuit for amplifying a transmission signal, and is constituted by a transistor for amplification. The transistor for amplification is a bipolar transistor such as a heterojunction bipolar transistor (HBT). A field-effect transistor (a metal-oxide-semiconductor field effect transistor (MOSFET)) may also be used as a transistor for amplification.

In this embodiment, the 3G/4G chip 110A is constituted by two amplification paths, namely, an amplification path for the low band and an amplification path for the middle band. The 2G chip 120 is constituted by two amplification paths, namely, an amplification path for the high band and an amplification path for the low band. Specifically, the power amplification circuits PA1 and PA2 are disposed in the amplification path for the 3G/4G low band, and the power amplification circuits PA3 and PA4 are disposed in the amplification path for the 3G/4G middle band. Thus, amplification paths each having two stages are constructed. The power amplification circuits PA5 to PA7 are disposed in the amplification path for the 2G high band, and the power amplification circuits PA8 to PA10 are disposed in the amplification path for the 2G low band. Thus, amplification paths each having three stages are constructed.

When a transmission signal RFlow (first transmission signal) in the 3G/4G low band (first frequency band) (for example, B5, B8, B20, or B26) is input from the input terminal (first input terminal) IN1 or IN2, the signal is supplied to the amplification path for the low band in the 3G/4G chip 110A by using the switch element SW1. The signal is fed through the filter circuit F1 and the matching network MN1 and is then amplified by the power amplification circuit PA1 (first amplification circuit) in the initial stage (drive stage). The resulting amplified signal (first amplified signal) is fed through the matching network MN2 and is then amplified by the power amplification circuit PA2 in the second stage (power stage), and the resulting amplified signal is output to the matching network MN3.

When a transmission signal RFmid (second transmission signal) in the 3G/4G middle band (second frequency band) (for example, any of B1 to B4) is input from the input terminal (second input terminal) IN3 or IN4, the signal is supplied to the amplification path for the middle band in the 3G/4G chip 110A by using the switch element SW2. The signal is fed through the filter circuit F2 and the matching network MN4 and is then amplified by the power amplification circuit PA3 (second amplification circuit) in the initial stage (drive stage). The resulting amplified signal (second amplified signal) is fed through the matching network MN5 and is then amplified by the power amplification circuit PA4 in the second stage (power stage), and the resulting amplified signal is output to the matching network MN6.

The amplification paths included in the 2G chip 120, for both the high band and the low band, each have a configuration in which a power amplification circuit in the third stage is added to the configuration of the amplification path for the 3G/4G middle band. Specifically, when a transmission signal GSM_HB in the 2G high band is input from the input terminal IN5, the transmission signal GSM_HB is supplied to the amplification path for the 2G high band through the capacitor C10. The signal is fed through the matching network MN7 and is then amplified by the power amplification circuit PA5. The resulting amplified signal is fed through the matching network MN8 and is then amplified by the power amplification circuit PA6. The resulting amplified signal is further fed through the matching network MN9 and is then amplified by the power amplification circuit PA7. The amplification path for the 2G low band is configured in a manner similar to that of the amplification path for the 2G high band, and will not be described in detail.

Next, a description is given of the operation and advantages of the filter circuits F1 and F2 in the 3G/4G chip 110A.

The filter circuit F1 (first filter circuit) is located between the switch element SW1 and the matching network MN1 in the amplification path for the low band, and performs a filtering process on the transmission signal RFlow before amplification. Specifically, the filter circuit F1 performs filtering to attenuate harmonics of the transmission signal RFlow and the transmission signal RFmid.

The filter circuit F1 can employ, for example, a low-pass filter that allows a component in a transmit frequency band within the frequency band of the transmission signal RFlow to pass therethrough and that attenuates harmonics of the transmission signal RFlow and the transmission signal RFmid, which lie in a frequency band higher than the transmit frequency band.

The filter circuit F2 (second filter circuit) is located between the switch element SW2 and the matching network MN4 in the amplification path for the middle band, and performs a filtering process on the transmission signal RFmid before amplification. Specifically, the filter circuit F2 performs filtering to attenuate the fundamental wave of the transmission signal RFlow in the low band.

The filter circuit F2 can employ, for example, a high-pass filter that allows a component in a transmit frequency band within the frequency band of the transmission signal RFmid to pass therethrough and that attenuates the fundamental wave of the transmission signal RFlow, which lies in a frequency band lower than the transmit frequency band.

In the applications of uplink carrier aggregation, transmission signals are amplified in a plurality of amplification paths on the same integrated circuit. This may cause a signal output from a power amplification circuit in one amplification path to leak into an input of a power amplification circuit in the other amplification path, which may result in intermodulation distortion (IMD). The IMD flows into the receive unit through, for example, a duplexer (not illustrated), leading to degradation of reception sensitivity.

For example, a transmission signal in the middle band B1 and a transmission signal in the low band B5 are to be simultaneously amplified. In this case, the difference between the second harmonic of the upper limit B1$f$_min (1920 MHz) of the transmit frequency band B1 and the second harmonic of the lower limit B5$f$_max (849 MHz) of the transmit frequency band B5 is given by 2×B1$f$_min−2×B5$f$_max=3840−1698=2142 MHz. The resulting frequency is included in the B1 receive frequency band (2110 to 2170 MHz) and the IMD may thus affect the B1 reception sensitivity. In this manner, in a situation where transmission signal leakage occurs, if sufficient isolation is not provided between the corresponding band and the other band, the leakage signal may leak into an amplification path for the other band and cause IMD.

In the power amplification module 100A, in contrast, the filter circuits F1 and F2 described above are included. This ensures sufficient isolation between the input terminal for the low band and the input terminal for the middle band. Specifically, when leakage of the transmission signal RFlow in the low band occurs, the fundamental component of the transmission signal RFlow will be attenuated before the transmission signal RFlow is amplified by the filter circuit F2 (for example, a high-pass filter) even if the transmission signal RFlow leaks into the amplification path for the middle band. In addition, a harmonic component of the transmission signal RFlow is attenuated before the transmission signal RFlow is amplified by the filter circuit F1 (for example, a low-pass filter) in the amplification path for the low band. Thus, the power of the leakage signal can be suppressed. This can prevent IMD from occurring in the amplification path for the middle band and can prevent a reduction in middle-band reception sensitivity.

If the transmission signal RFmid leaks from the amplification path for the middle band into the amplification path for the low band, the leakage signal is attenuated by the filter circuit F1 (for example, a low-pass filter), thereby preventing the transmission signal RFmid from leaking into the amplification path for the low band. This can prevent IMD from occurring in the amplification path for the low band and can prevent a reduction in low-band reception sensitivity.

As described above, the power amplification module 100A can prevent the respective signals in the low band and the middle band from mutually leaking, thereby preventing occurrence of intermodulation distortion. In addition, the use of a low-pass filter or a high-pass filter as the filter circuit F1 or F2 can suppress the degradation in efficiency caused by insertion loss in the pass band, compared to the use of a bandpass filter. The reason for this is as follows. In a bandpass filter that allows the desired frequency band to pass therethrough, a resonator is used to block frequency bands other than the desired frequency band from passing therethrough. On the other hand, a low-pass filter or a high-pass filter is sufficient to attenuate frequencies higher or lower than the cut-off frequency, and thus no resonator is required. For this reason, the use of a low-pass filter or a high-pass filter can reduce insertion loss, compared to the use of a bandpass filter including a resonator.

Figure 5:
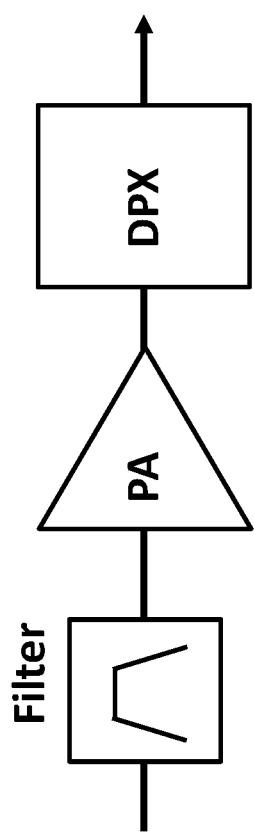
FIG. 5 is a diagram illustrating a configuration of connections between filter circuits, amplification circuits, and duplexers for power amplification modules according to the present disclosure.

It is assumed here that the amplification paths for the low and middle bands are defined on the same integrated circuit and that an output signal of a power amplification circuit for the low band has leaked into an input terminal of a power amplification circuit for the middle band. In this case, the output signal of the power amplification circuit for the low band is assumed to have a level of substantially 26 decibels above 1 milliwatt (dBm). It is also assumed that a spatial isolation characteristic of substantially −36 dB is exhibited on the same integrated circuit and that a duplexer connected to an end of a power amplification circuit for the middle band (e.g., as illustrated in FIG. 5) has an isolation characteristic of substantially −48 dB. In the conditions described above, an output signal in the low band is attenuated by an amount corresponding to the spatial isolation characteristic and a signal of approximately −10 dBm is input to the input terminal of the power amplification circuit for the middle band. This signal (approximately −10 dBm) is input to the power amplification circuit for the middle band, and noise (approximately −37 dBm) caused by IMD is output from the output terminal of the power amplification circuit for the middle band. This noise (substantially −37 dBm) passes through the duplexer for the middle band to yield noise having a power level of substantially −85 dBm, which is then output as noise of the receive signal.

Since a typical mobile phone has a minimum reception sensitivity of, for example, substantially −110 dBm, the noise described above is larger than the minimum reception sensitivity by approximately 25 dB. Thus, an attenuation of substantially 25 dB or more is achieved by the filter circuits F1 and F2, thereby allowing noise generated due to IMD to be made less than the minimum reception sensitivity.

In FIG. 1, the filter circuits F1 and F2 are integrated together on the 3G/4G chip 110A, by way of example. However, the filter circuits F1 and F2 may not necessarily be located on the 3G/4G chip 110A. Implementing the filter circuits F1 and F2 using passive elements on the 3G/4G chip 110A allows a filtering process to be carried out at low cost without necessarily increasing the circuit size. For example, instead of using the filter circuits F1 and F2, the matching networks MN1 and MN4 on the 3G/4G chip 110A may be used as the filter circuits F1 and F2, respectively.

Each filter may be, for example, but not limited to, an LC filter. For example, a surface acoustic wave (SAW) filter or a dielectric filter may be used.

Figure 2:
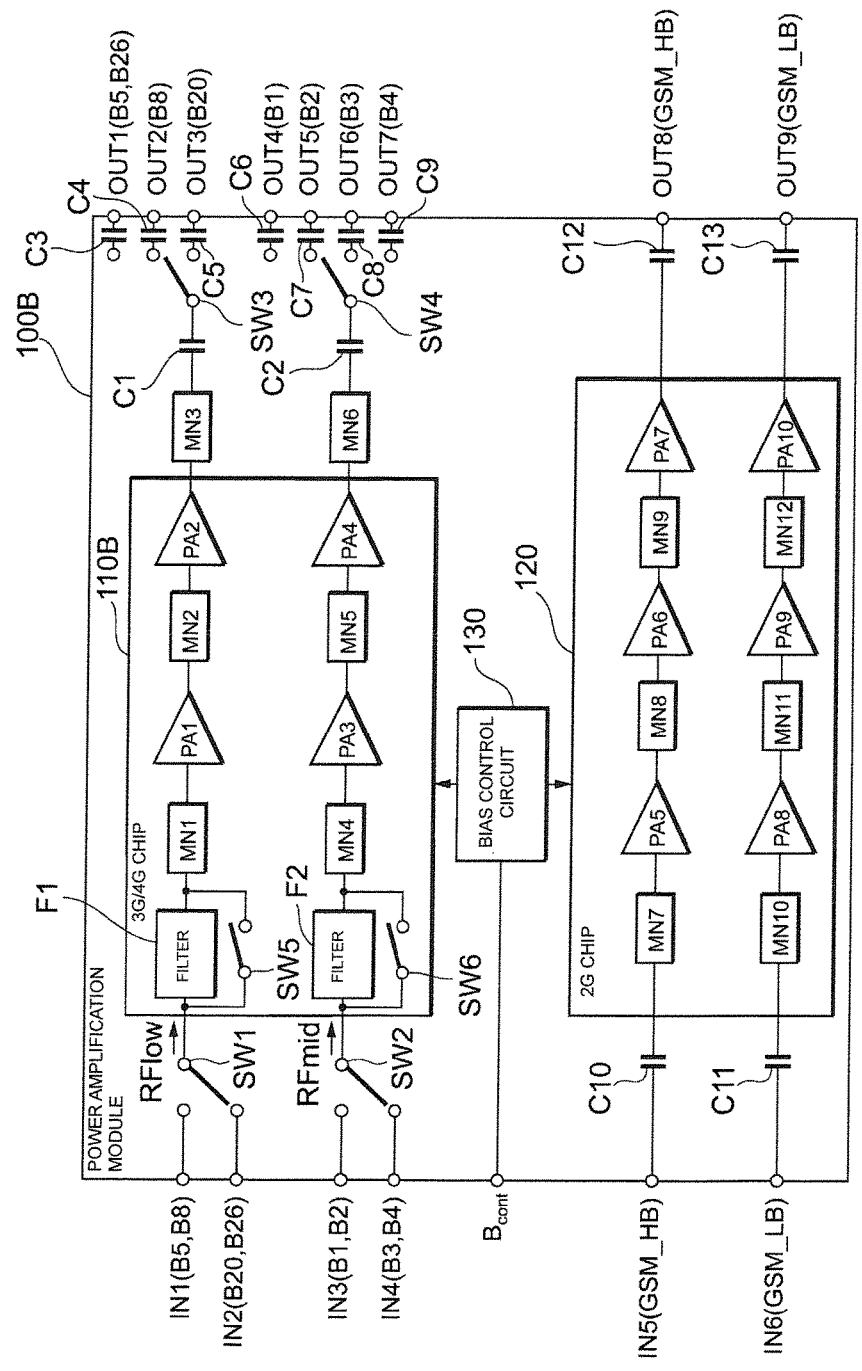
FIG. 2 is a diagram illustrating a configuration of a power amplification module according to another embodiment of the present disclosure.

FIG. 2 is a diagram illustrating a configuration of a power amplification module 100B according to another embodiment of the present disclosure. The same or substantially the same components as those in the power amplification module 100A are assigned the same numerals and are not described. In this embodiment, a description is not given of features common to the power amplification module 100A and only different features are described. In particular, similar operations and advantages achievable by similar configurations are not described in individual embodiments.

The power amplification module 100B includes a 3G/4G chip 110B in place of the 3G/4G chip 110A in the power amplification module 100A.

The 3G/4G chip 110B is different from the 3G/4G chip 110A illustrated in FIG. 1 in that the 3G/4G chip 110B further includes switch elements SW5 and SW6.

The switch element SW5 (first switch element) is connected in parallel to the filter circuit F1, and the switch element SW6 (second switch element) is connected in parallel to the filter circuit F2. That is, when the switch element SW5 is turned on, the transmission signal is supplied to the power amplification circuit PA1 via the switch element SW5. When the switch element SW6 is turned on, the transmission signal is supplied to the power amplification circuit PA3 via the switch element SW6.

The switch element SW5 is turned on when the transmission signal RFmid in the middle band is not input and when the amplification path for the middle band is not in operation, and is turned off when the transmission signal RFmid is input and when the amplification path for the middle band is in operation. That is, when the amplification paths for the middle band and the low band are not in use simultaneously, the switch element SW5 is turned on so as to allow the avoidance of the insertion loss caused by the filter circuit F1 to override the prevention of the occurrence of IMD. Thus, the transmission signal RFlow can be supplied to the power amplification circuit PA1 without necessarily passing through the filter circuit F1. The transmission signal RFlow can avoid the insertion loss in the pass band of the filter circuit F1.

Likewise, the switch element SW6 is turned on when the transmission signal RFlow in the low band is not input and when the amplification path for the low band is not in operation, and is turned off when the transmission signal RFlow is input and when the amplification path for the low band is in operation. Thus, the transmission signal RFmid can be supplied to the power amplification circuit PA3 without necessarily passing through the filter circuit F2 when the amplification paths for the middle band and the low band are not in use simultaneously. The transmission signal RFmid can avoid the insertion loss in the pass band of the filter circuit F2.

As described above, the power amplification module 100B is provided with the switch elements SW5 and SW6. This configuration does not allow a filter circuit to operate, in accordance with whether uplink carrier aggregation is used or not, while preventing the occurrence of intermodulation distortion, thereby achieving an improvement in the efficiency of the power amplification module 100B.

In FIG. 2, furthermore, the switch elements SW5 and SW6 are integrated together on the 3G/4G chip 110B, by way of example. However, the switch elements SW5 and SW6 may not necessarily be located on the 3G/4G chip 110B. Integration of the switch elements SW5 and SW6 together on the 3G/4G chip 110B can avoid an increase in circuit size.

The configuration for bypassing a filter circuit in accordance with whether uplink carrier aggregation is used or not is not limited to that described above. For example, a bypass path that bypasses a filter circuit and a switch element that selects one of a pass that passes through the filter circuit and the bypass path may be provided and the switch element may be controlled in accordance with whether uplink carrier aggregation is used or not.

Figure 3:
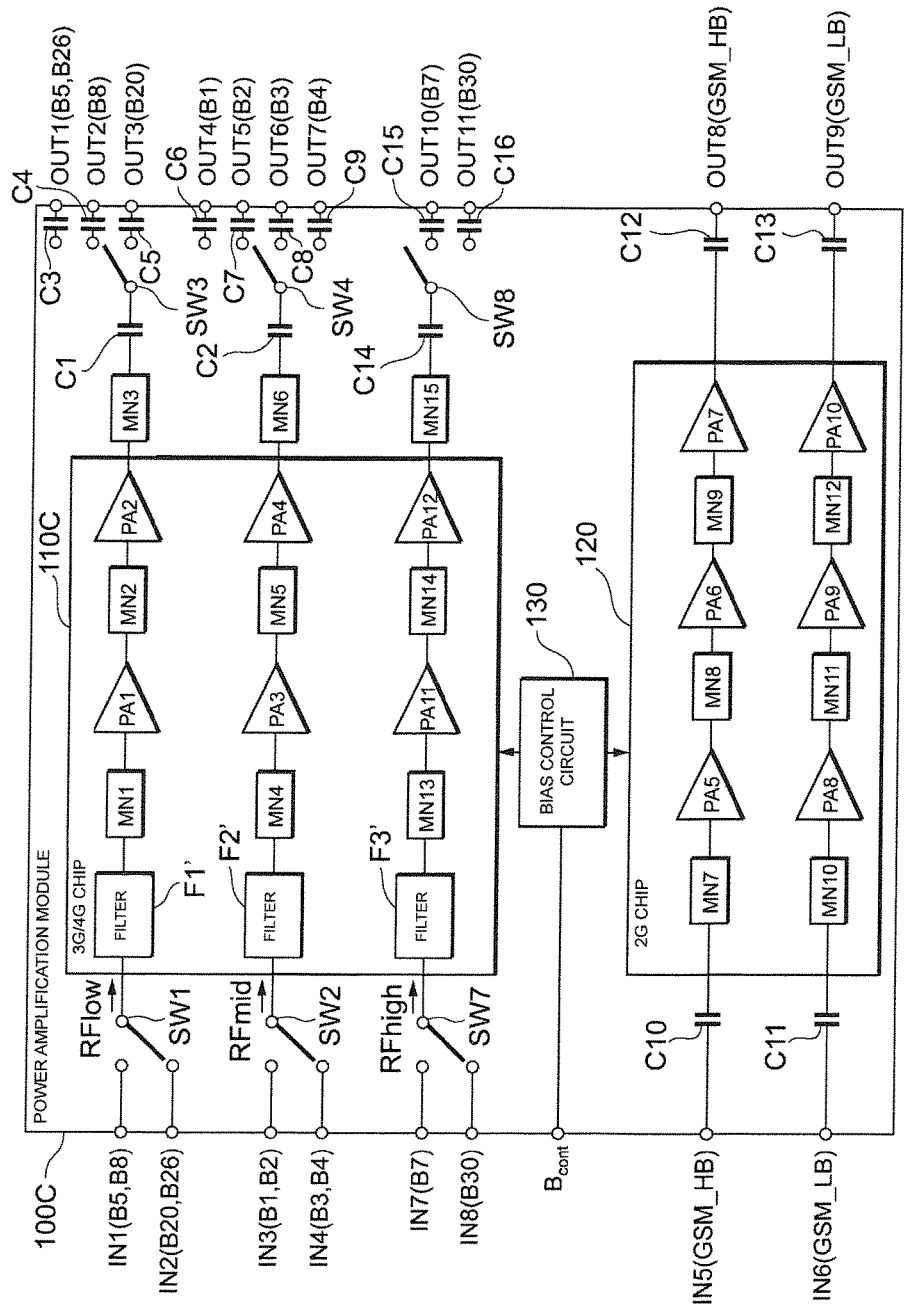
FIG. 3 is a diagram illustrating a configuration of a power amplification module according to still another embodiment of the present disclosure.

FIG. 3 is a diagram illustrating a configuration of a power amplification module 100C according to still another embodiment of the present disclosure. The same or substantially the same components as those in the power amplification module 100A are assigned the same numerals and are not described. In this embodiment, a description is not given of features common to the power amplification module 100A and only different features are described. In particular, similar operations and advantages achievable by similar configurations are not described in individual embodiments.

The power amplification module 100C further includes an amplification path for a 3G/4G high band in addition to the configuration of the power amplification module 100A. Specifically, the power amplification module 100C further includes power amplification circuits PA11 and PA12, a filter circuit F3', matching networks MN13 to MN15, capacitors C14 to C16, and switch elements SW7 and SW8.

The power amplification module 100C supports, in addition to transmission signals in the frequency bands corresponding to the 3G/4G low and middle bands, transmission signals in a high band that is a frequency band higher than the middle band. In FIG. 3, two frequency bands, namely, B7 (transmit frequency band: 2500 to 2570 MHz) and B30 (transmit frequency band: 2305 to 2315 MHz), are depicted as example frequency bands (third frequency band) in the 3G/4G high band. However, other frequency bands may be employed.

The amplification path for the high band has a configuration similar to that of the amplification paths for the low and middle bands, except for the filter circuit F3'. Specifically, when a transmission signal RFhigh (third transmission signal) in a 3G/4G high band (third frequency band) (for example, B7 or B30) is input from an input terminal (third input terminal) IN7 or IN8, the signal is supplied to the amplification path for the high band in a 3G/4G chip 110C by using the switch element SW7. The signal is fed through the matching network MN13 and is then amplified by the power amplification circuit PA11 (third amplification circuit) in the initial stage. The resulting amplified signal (third amplified signal) is fed through the matching network MN14 and is then amplified by the power amplification circuit PA12 in the second stage, and the resulting amplified signal is output to the matching network MN15.

Since the power amplification module 100C supports three frequency bands, a filter circuit F2' included in the amplification path for the middle band has a configuration different from the filter circuit F2 in the power amplification module 100A. In the following, filter circuits F1' to F3' in the power amplification module 100C will be described in detail.

First, the filter circuit F1' included in the amplification path for the low band is similar to the filter circuit F1 in the power amplification module 100A. Specifically, the filter circuit F1' can employ, for example, a low-pass filter that allows a component in a transmit frequency band within the frequency band of the transmission signal RFlow to pass therethrough and that attenuates harmonics of the transmission signal RFlow, the transmission signal RFmid, and the transmission signal RFhigh, which have frequencies higher than the transmit frequency band.

The filter circuit F2' included in the amplification path for the middle band employs, for example, a bandpass filter that allows a component in a transmit frequency band within the frequency band of the transmission signal RFmid to pass therethrough and that attenuates the fundamental wave of the transmission signal RFlow, which has a frequency lower than the transmit frequency band, and harmonics of the transmission signal RFmid and the transmission signal RFhigh, which have frequencies higher than the transmit frequency band. A bandpass filter is used as the filter circuit F2' in order to suppress IMD caused by action of the transmission signal RFhigh as well as IMD caused by action of the transmission signal RFlow.

The filter circuit F3' (third filter circuit) is disposed in the amplification path for the high band between the switch element SW7 and the matching network MN13, and performs a filtering process on the transmission signal RFhigh before amplification. Specifically, the filter circuit F3' performs filtering to attenuate the fundamental waves of the transmission signal RFlow and the transmission signal RFmid.

The filter circuit F3' can employ, for example, a high-pass filter that allows a component in a transmit frequency band within the frequency band of the transmission signal RFhigh to pass therethrough and that attenuates the fundamental waves of the transmission signal RFlow and the transmission signal RFmid, which have frequencies lower than the transmit frequency band.

The configuration described above can prevent leakage of the respective transmission signals in the low band, the middle band, and the high band and can also prevent the occurrence of IMD caused by each of the respective signals leaking into the other amplification paths.

Each of the filter circuits F1' to F3' may be implemented using a bandpass filter. However, implementing only the filter circuit F2' using a bandpass filter can suppress the degradation in efficiency caused by an increase in circuit size and by insertion loss of a filter circuit.

Similarly to the filter circuits F1 and F2 in the power amplification module 100A, the filter circuit F3' may not necessarily be located on the 3G/4G chip 110C. The filter circuit F3' may be implemented using a passive element on the 3G/4G chip 110C. For example, the matching network MN13 on the 3G/4G chip 110C may be used as the filter circuit F3'.

Figure 4A:
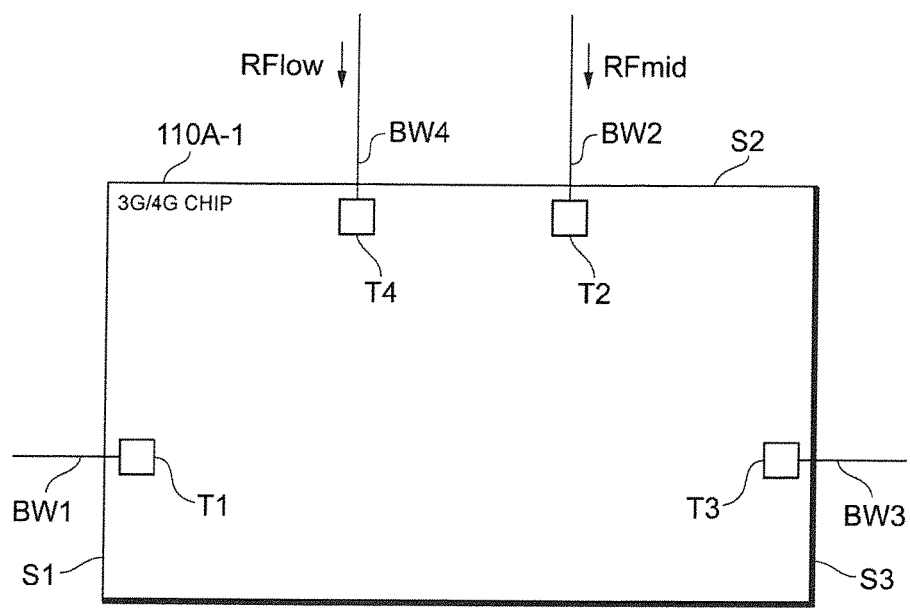
FIG. 4A is a schematic diagram of an example arrangement of terminals of a 3G/4G chip in the power amplification module illustrated in FIG. 1.

FIG. 4A is a schematic diagram of an example arrangement of terminals of the 3G/4G chip 110A (a 3G/4G chip 110A-1) in the power amplification module 100A. FIG. 4A illustrates only terminals T1 to T4, described below, among the components of the 3G/4G chip 110A-1, and the other components are not illustrated.

The terminal T1 (first terminal) is an output terminal for the amplified signal (first amplified signal) obtained by the power amplification circuit PA1 in the initial stage in the amplification path for the low band, and is defined near a side S1 (first side) of the 3G/4G chip 110A-1. Further, a bonding wire BW1 is connected to the terminal T1.

The terminal T2 (second terminal) is an input terminal to which the transmission signal RFmid in the middle band is input from outside the 3G/4G chip 110A-1, and is defined near a side S2 (second side) adjacent to the side S1 of the 3G/4G chip 110A-1. Further, a bonding wire BW2 is connected to the terminal T2.

The terminal T3 (third terminal) is an output terminal for the amplified signal (second amplified signal) obtained by the power amplification circuit PA3 in the initial stage in the amplification path for the middle band, and is defined near a side S3 (third side) of the 3G/4G chip 110A-1. Further, a bonding wire BW3 is connected to the terminal T3.

The terminal T4 (fourth terminal) is an input terminal to which the transmission signal RFlow in the low band is input from outside the 3G/4G chip 110A-1, and is defined near the side S2 (fourth side), which is adjacent to the side S3 of the 3G/4G chip 110A-1. Further, a bonding wire BW4 is connected to the terminal T4.

The power amplification module 100A may be configured such that, for each of the amplification paths for the low and middle bands, part (for example, an inductor) of the matching network (MN2 or MN5) for matching the output impedance of the power amplification circuit (PA1 or PA3) in the initial stage to the input impedance of the power amplification circuit (PA2 or PA4) in the second stage is located outside the 3G/4G chip 110A-1. In this case, the amplified signal in the low band which is obtained by the power amplification circuit PA1 in the initial stage is output to the outside of the 3G/4G chip 110A-1 via the terminal T1 and the bonding wire BW1. Likewise, the amplified signal in the middle band which is obtained by the power amplification circuit PA3 in the initial stage is output to the outside of the 3G/4G chip 110A-1 via the terminal T3 and the bonding wire BW3.

In this embodiment, the respective terminals are defined in such a manner that the bonding wire BW1, which is connected to the output terminal T1 for the low band, and the bonding wire BW2, which is connected to the input terminal T2 for the middle band, are oriented substantially perpendicular to each other. Likewise, the respective terminals are defined in such a manner that the bonding wire BW3, which is connected to the output terminal T3 for the middle band, and the bonding wire BW4, which is connected to the input terminal T4 for the low band, are oriented substantially perpendicular to each other. This configuration allows a magnetic field of a signal output from an output terminal for one frequency band to be substantially perpendicular to a magnetic field of a signal input from an input terminal for the other frequency band. Accordingly, the effect of a transmission signal in one frequency band on a transmission signal in the other frequency band can be reduced.

As illustrated in FIG. 4A, furthermore, the output terminal T1 for the low band is located in the side S1 at a position far away from the side S2. The input terminal T2 for the middle band is located in the side S2 at a position far away from the side S1. Thus, the distance between the output terminal T1 for the low band and the input terminal T2 for the middle band is long. Likewise, the output terminal T3 for the middle band is located in the side S3 at a position far away from the side S2. The input terminal T4 for the low band is located in the side S2 at a position far away from the side S3. Thus, the distance between the output terminal T3 for the middle band and the input terminal T4 for the low band is long. This configuration provides improved spatial isolation between an input terminal for a transmission signal in one frequency band and an output terminal for a transmission signal in the other frequency band.

With the configuration described above, the power amplification module 100A can further prevent degradation of reception sensitivity.

In this embodiment, the terminal T2 and the terminal T4 are defined near the same side, namely, the side S2. However, the arrangement of the terminals is not limited to this configuration, and, for example, the terminal T2 and the terminal T4 may be defined near opposite sides.

Figure 4B:
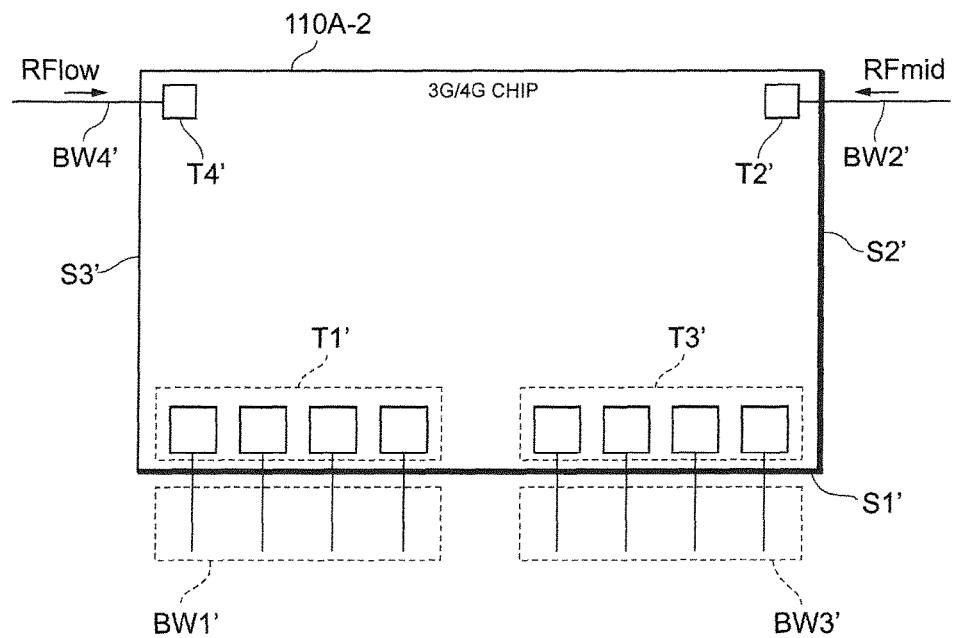
FIG. 4B is a schematic diagram of another example arrangement of terminals of the 3G/4G chip in the power amplification module illustrated in FIG. 1.

FIG. 4B is a schematic diagram of another example arrangement of terminals of the 3G/4G chip 110A (a 3G/4G chip 110A-2) in the power amplification module 100A. FIG. 4B illustrates only terminals T1' to T4', described below, among the components of the 3G/4G chip 110A-2, and the other components are not illustrated.

The terminal T1' (first terminal) is an output terminal for the amplified signal output from the power amplification circuit PA2 in the second stage in the amplification path for the low band, and is defined near a side S1' (first side) of the 3G/4G chip 110A-2. That is, the amplified signal (first amplified signal) output from the power amplification circuit PA1 in the initial stage is output from the terminal T1' via the matching network MN2 and the power amplification circuit PA2. The amplified signal output from the power amplification circuit PA2 in the second stage has a larger amount of current. Thus, in the configuration illustrated in FIG. 4B, the terminal T1' is constituted by four terminals. The terminal T1' may not necessarily be constituted by four terminals but may be constituted by one terminal or by more than four terminals.

The terminal T2' (second terminal) is an input terminal to which the transmission signal RFmid in the middle band is input from outside the 3G/4G chip 110A-2, and is defined near a side S2' (second side) adjacent to the side S1' of the 3G/4G chip 110A-2.

The terminal T3' (third terminal) is an output terminal for the amplified signal output from the power amplification circuit PA4 in the second stage in the amplification path for the middle band, and is defined near the side S1' (third side) of the 3G/4G chip 110A-2. That is, the amplified signal (second amplified signal) output from the power amplification circuit PA3 in the initial stage is output from the terminal T3' via the matching network MN5 and the power amplification circuit PA4. In the configuration illustrated in FIG. 4B, similarly to the terminal T1', the terminal T3' is also constituted by a plurality of terminals.

The terminal T4' (fourth terminal) is an input terminal to which the transmission signal RFlow in the low band is input from outside the 3G/4G chip 110A-2, and is defined near a side S3' (fourth side) adjacent to the side S1' of the 3G/4G chip 110A-2.

As in the 3G/4G chip 110A-1, bonding wires BW1' to BW4' are connected to the terminals T1' to T4', respectively.

Also in the 3G/4G chip 110A-2, as in the 3G/4G chip 110A-1, the bonding wire BW1', which is connected to the terminal T1', and the bonding wire BW2', which is connected to the terminal T2', are oriented substantially perpendicular to each other. In addition, the bonding wire BW3', which is connected to the terminal T3', and the bonding wire BW4', which is connected to the terminal T4', are oriented substantially perpendicular to each other. As in the 3G/4G chip 110A-1, furthermore, the respective terminals are arranged in such a manner that the distance between the terminal T1' and the terminal T2' is long and the distance between the terminal T3' and the terminal T4' is long. This configuration provides improved spatial isolation between an input terminal for a transmission signal in one frequency band and an output terminal for a transmission signal in the other frequency band.

Accordingly, the 3G/4G chip 110A-2 also can further prevent degradation of reception sensitivity.

The arrangement of the terminals of the 3G/4G chips 110A-1 and 110A-2 illustrated in FIGS. 4A and 4B is also applicable to the 3G/4G chips 110B and 110C.

Exemplary embodiments of the present disclosure have been described. The power amplification modules 100A to 100C are power amplification modules that support uplink carrier aggregation, in which the filter circuits F1 (F1') and F2 (F2') are located between the input terminals IN1 to IN4 and the power amplification circuits PA1 and PA3 for the 3G/4G low and middle bands. In addition, the filter circuit F1 can be configured using a low-pass filter and the filter circuit F2 can be configured using a high-pass filter. This configuration allows the transmission signal RFlow to be attenuated by the filter circuit F2 (F2') and harmonics of the transmission signal RFlow and the transmission signal RFmid to be attenuated by the filter circuit F1 (F1'). This can prevent the respective signals in the low band and the middle band from mutually leaking, and can prevent the occurrence of intermodulation distortion. It may thus be possible to prevent degradation of reception sensitivity while preventing degradation of power efficiency.

The power amplification module 100C further includes an amplification path for the 3G/4G high band in addition to the configuration of the power amplification module 100A. In addition, the filter circuit F1' can be configured using a low-pass filter, the filter circuit F2' can be configured using a bandpass filter, and the filter circuit F3' can be configured using a high-pass filter. This configuration can, even if the power amplification module 100C supports three frequency bands, prevent the respective signals in the low band, the middle band, and the high band from mutually leaking, and can prevent the occurrence of intermodulation distortion. It may thus be possible to prevent degradation of reception sensitivity while preventing degradation of power efficiency.

Each of the filter circuits F1 (F1'), F2 (F2'), and F3' may be integrated together on the 3G/4G chips 110A to 110C. This allows a filtering process to be carried out at low cost without increasing the circuit size.

Alternatively, the matching networks MN1, MN4, and MN13 included in the 3G/4G chip may be used as the filter circuits F1 (F1'), F2 (F2'), and F3', respectively.

The power amplification module 100B further includes the switch elements SW5 and SW6, which are respectively connected in parallel to the filter circuits F1 and F2, in addition to the configuration of the power amplification module 100A. This provides a configuration in which, when one amplification path is not in operation, a switch element in the other amplification path is turned on to prevent the transmission signal from passing through the filter circuit. This can avoid insertion loss in the pass band of a filter circuit while preventing the occurrence of intermodulation distortion, in accordance with whether uplink carrier aggregation is used or not, achieving an improvement in efficiency.

In the power amplification module 100B, furthermore, the switch elements SW5 and SW6 may be integrated together on the 3G/4G chip 110B. This configuration can avoid an increase in circuit size.

Furthermore, the respective terminals may be defined on the 3G/4G chip 110A in such a manner that the bonding wires BW1 and BW3, which are respectively connected to the output terminals T1 and T3 for one frequency band, are oriented substantially perpendicular to the bonding wires BW2 and BW4, which are respectively connected to the input terminals T2 and T4 for the other frequency band. This allows magnetic fields of the respective transmission signals to be substantially perpendicular to each other, and can reduce the effect of the transmission signal in one frequency band on the transmission signal in the other frequency band. Accordingly, degradation of reception sensitivity can further be prevented.

The embodiments described above are provided for easy understanding of the present disclosure, and it is not intended to limit the present disclosure to the embodiments only. Modifications and improvements may be made to the present disclosure without departing from the spirit of the present disclosure, and the equivalents thereof are also encompassed by the present disclosure. That is, these embodiments may be appropriately modified in design by those skilled in the art, and such modifications also fall within the scope of the present disclosure so long as the modifications include the features of the present disclosure. For example, the respective elements included in the embodiments described above and the arrangement, materials, conditions, shapes, sizes, and the like thereof are not limited to those described in the illustrated examples but can be modified appropriately. It is also to be understood that the embodiments described above are for illustrative purposes and partial substitutions or combinations of elements illustrated in different embodiments may be made, and such substitutions or combinations also fall within the scope of the present disclosure so long as the substitutions or combinations include the features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification module comprising:
    a first filter circuit that allows a first transmission signal in a first frequency band to pass therethrough, attenuates a harmonic of the first transmission signal, and attenuates a second transmission signal in a second frequency band;
    a second filter circuit that allows the second transmission signal to pass therethrough, attenuates the first transmission signal, and attenuates a third transmission signal in a third frequency band;
    a first amplification circuit that receives the first transmission signal from the first filter circuit, amplifies the first transmission signal to produce a first amplified signal, and outputs the first amplified signal; and
    a second amplification circuit that receives the second transmission signal from the second filter circuit, amplifies the second transmission signal to produce a second amplified signal, and outputs the second amplified signal,
    wherein the second frequency band is higher than the first frequency band, and the third frequency band is higher than the second frequency band.

2. The power amplification module according to claim 1, wherein the first filter circuit comprises a low pass filter and the second filter circuit comprises a bandpass filter, the second frequency band being in a pass band of the bandpass filter, and the first frequency band and the third frequency band being in a stop band of the bandpass filter.

3. The power amplification module according to claim 2, wherein the power amplification module supports uplink carrier aggregation.

4. The power amplification module according to claim 1, wherein an output of the second amplification circuit is connected to a duplexer.

5. The power amplification module according to claim 1, wherein an output of the first amplification circuit is connected to a duplexer.

6. The power amplification module according to claim 5, wherein the power amplification module supports uplink carrier aggregation.

7. The power amplification module according to claim 1, wherein at least one of the first filter circuit and the second filter circuit is integrated with the first amplification circuit and the second amplification circuit.

8. The power amplification module according to claim 1, wherein:
    the first filter circuit or the second filter circuit is configured to match an output impedance of a circuit located upstream of the corresponding one of the first amplification circuit and the second amplification circuit to an input impedance of the corresponding one of the first amplification circuit and the second amplification circuit, and
    a filter attenuation level of the first filter circuit and a filter attenuation level of the second filter circuit are each at least 25 dB.

9. The power amplification module according to claim 1, further comprising a first switch connected in parallel to the first filter circuit,
    wherein the first switch is turned on when the second transmission signal is not input.

10. The power amplification module according to claim 9, wherein the first switch is integrated with the first amplification circuit and the second amplification circuit.

11. The power amplification module according to claim 9, wherein the power amplification module supports uplink carrier aggregation.

12. The power amplification module according to claim 1, further comprising a second switch connected in parallel to the second filter circuit,
    wherein the second switch is turned on when the first transmission signal is not input.

13. The power amplification module according to claim 12, wherein the second switch is integrated with the first amplification circuit and the second amplification circuit.

14. The power amplification module according to claim 1, wherein the power amplification module supports uplink carrier aggregation.

15. The power amplification module according to claim 1, further comprising:
   a first input terminal arranged to receive the first transmission signal;
   a second input terminal arranged to receive the second transmission signal; and
   a first output terminal arranged to output the first amplified signal,
   wherein the first output terminal is on a first side of an integrated circuit, the integrated circuit including the first amplification circuit and the second amplification circuit,
   wherein the second input terminal is on a second side of the integrated circuit, the second side being adjacent to the first side of the integrated circuit, and
   wherein a line connected to the first output terminal and a line connected to the second input terminal are oriented substantially perpendicular to each other.

16. The power amplification module according to claim 15, further comprising:
   a second output terminal arranged to output the second amplified signal,
   wherein the second output terminal is on a third side of the integrated circuit,
   wherein the first input terminal is on the second side of the integrated circuit, the second side being adjacent to the third side of the integrated circuit, and
   wherein a line connected to the second output terminal and a line connected to the first input terminal are oriented substantially perpendicular to each other.

17. The power amplification module according to claim 16, wherein the first input terminal is closer than the second input terminal to the second side of the integrated circuit, and the second input terminal is closer than the first input terminal to the third side of the integrated circuit.

18. The power amplification module according to claim 15, further comprising:
   a second output terminal arranged to output the second amplified signal,
   wherein the first input terminal is on a third side of the integrated circuit,
   wherein the second output terminal is on the second side of the integrated circuit, the second side being adjacent to the third side of the integrated circuit, and
   wherein a line connected to the second output terminal and a line connected to the first input terminal are oriented substantially perpendicular to each other.

19. The power amplification module according to claim 18, wherein the first output terminal is closer than the second output terminal to the third side of the integrated circuit, and the second output terminal is closer than the first output terminal to the first side of the integrated circuit.

20. The power amplification module according to claim 15, wherein the power amplification module supports uplink carrier aggregation.

* * * * *